(12) United States Patent
Yamaguchi et al.

(10) Patent No.: US 6,888,254 B2
(45) Date of Patent: May 3, 2005

(54) SEMICONDUCTOR DEVICE (75) Inventors: Akira Yamaguchi, Kitaadachi-gun (JP); Muneaki Maeno, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/966,440

(22) Filed: Sep. 27, 2001

(65) Prior Publication Data
US 2002/0036354 A1 Mar. 28, 2002

(30) Foreign Application Priority Data
Sep. 28, 2000 (JP) ........................................ 2000-297670

(51) Int. Cl.[7] .................. H01L 27/10; H01L 29/73; H01L 23/52; H01L 23/48; H01L 23/04; H01L 23/12; H01L 23/053; H01L 29/40
(52) U.S. Cl. ..................... 257/775; 257/207; 257/208; 257/203; 257/211; 257/700; 257/701; 257/758; 257/691; 257/692; 257/698; 257/775
(58) Field of Search ............................... 257/203, 207, 257/208, 211, 700, 701, 758, 691, 692, 698, 775

(56) References Cited
U.S. PATENT DOCUMENTS
5,488,542 A * 1/1996 Ito ............................... 361/793
6,078,100 A * 6/2000 Duesman et al. ............ 257/690
6,246,112 B1 * 6/2001 Ball et al. .................... 257/690
6,262,487 B1 * 7/2001 Igarashi et al. .............. 257/459

FOREIGN PATENT DOCUMENTS
JP 10-173055 6/1998
JP 2000-297670 6/2004

* cited by examiner

Primary Examiner—Nathan J. Flynn
Assistant Examiner—Victor A. Mandala, Jr.
(74) Attorney, Agent, or Firm—Gray Cary Ware & Freidenrich LLP (57) ABSTRACT

First and second IP cores are formed on one chip. Each of the first and second IP cores has metal layers. In the first IP core, an uppermost layer of the metal layers is thick and is a layer on which a core power source line is formed. In the second IP core, a metal layers equal in level to the uppermost layer in the first IP core becomes an intermediate layer. In the second IP core, thin intermediate layers are formed on this intermediate layer. Thin intermediate layers are layers on which signal lines are formed and have a narrow wiring pitch. In the second IP core, a layer on which a power source line is formed is provided on the thin intermediate layers.

32 Claims, 9 Drawing Sheets

SUBSTRATE

| WIRING LAYER | REFERENCE EXAMPLE | | PRESENT INVENTION | PURPOSE OF USING |
|---|---|---|---|---|
| Mn | TK | TK TK TK | TK TK | CHIP POWER SOURCE LINE |
| ⋮ | | | | |
| Mm+2 | TN | TK TK TK | TN TK | SIGNAL LINE |
| Mm+1 | TN | TN TK TK | TN TN | SIGNAL LINE |
| Mm (IP CORE) | TN | TN TN TK | TK TK | CORE POWER SOURCE LINE/ SIGNAL LINE |
| ⋮ | | | | |
| M2 | TN | TN TN TN | TN TN | SIGNAL LINE |
| M1 | TN | TN TN TN | TN TN | SIGNAL LINE |

TK : THICK
TN : THIN

F I G. 29

- IP1, IP2, IP4 :
  Mm is used as CORE power source line

- IP3 :
  Mm is used as signal line

~CHIP

F I G. 30

SEMICONDUCTOR DEVICE

CROSS-REFERENCE TO RELATED APPLICATIONS

This application is based upon and claims the benefit of priority from the prior Japanese Patent Application No. 2000-297670, filed Sep. 28, 2000, the entire contents of which are incorporated herein by reference.

BACKGROUND

The present invention relates to a semiconductor device having a multilayer wiring structure. The present invention is particularly applied to a system LSI manufactured using an IP core.

The recent development of the process technique has accelerated the microstructure and high integration of semiconductor elements. Following them, it has become possible to mount an entire system on one chip. A circuit constituting the system is, however, large in scale and complicated. To design such a circuit from a gate level, considerable resources are required, which is disadvantageous in efficiency.

To enhance LSI design efficiency including the above-stated disadvantage, a design method for recycling past design properties and assembling them on a chip for a general-purpose block is gradually spread.

Meanwhile, such design properties are referred to as IP's (Intellectual Properties), stored as an IP core in a library and freely picked up as required.

SUMMARY

A semiconductor device according to the aspect of the present invention comprises a lowermost layer nearest to a semiconductor substrate, an uppermost layer farthest from the semiconductor substrate and intermediate layers arranged between the lowermost layer and the uppermost layer. If assuming that one of the intermediate layers is the first intermediate layer and the other one is the second intermediate layer, the first intermediate layer is on the lowermost layer side compared with the second intermediate layer and thicker than the second intermediate layer.

The first intermediate layer comprises a first area having signal lines and a second area having power source lines, and a pitch of the power source lines is wider than that of the signal lines. And the first intermediate layer comprises a first area having signal lines and a second area having power source lines, and a width of each of the power source lines is wider than that of the signal lines.

DETAILED DESCRIPTION

Semiconductor device of the present invention will be hereinafter described with reference to the drawings.

1. Reference Example

First, description will be given to a reference example which forms a basis for the present invention.

Figure 1:
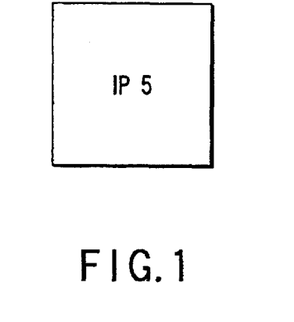
FIG. 1 shows an IP core.
Figure 2:
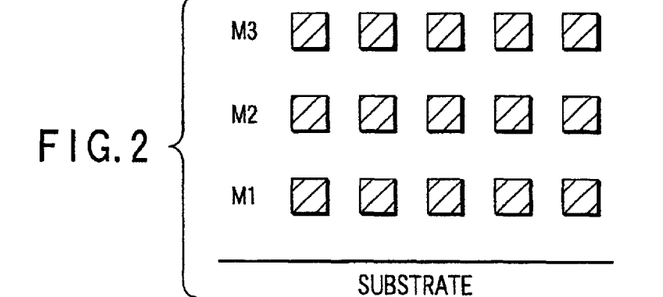
FIG. 2 is a cross-sectional view showing the device structure of the IP core shown in FIG. 1.

FIG. 1 shows an IP core. FIG. 2 shows one example of the device structure of the IP core shown in FIG. 1.

Figure 3:
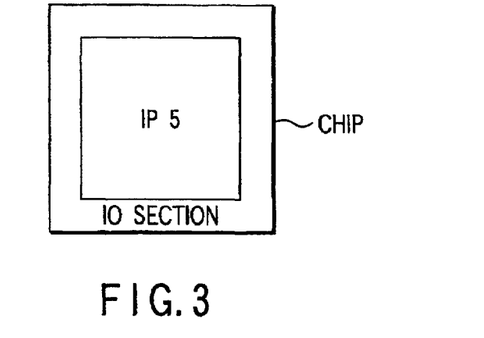
FIG. 3 shows a chip on which the IP core shown in FIG. 1 is mounted.
Figure 4:
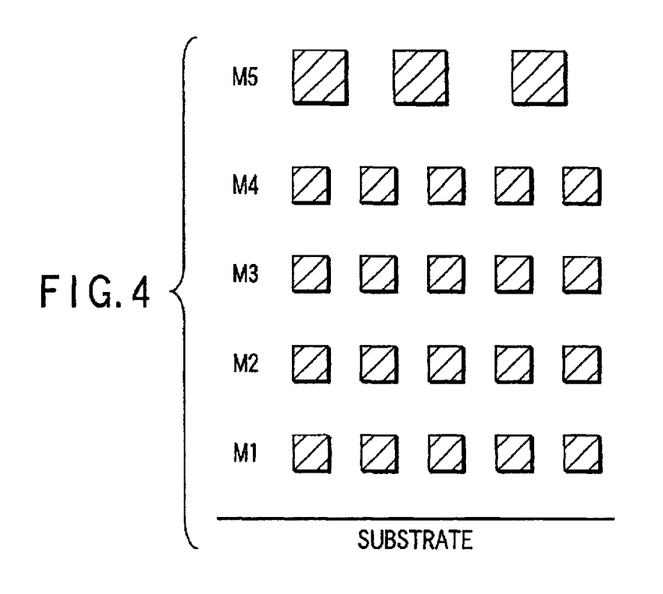
FIG. 4 is a cross-sectional view showing the structure of a semiconductor device shown in FIG. 3.

In this example, the IP core is realized by three metal layers M1, M2 and M3. These metal layers M1, M2 and M3 have the same thickness and formed into thin wiring layers. If this IP core is used during a design phase, the metal layers M1, M2 and M3 are used as they are. In addition, as shown in FIGS. 3 and 4, metal layers M4 and M5 are added, thereby forming a predetermined functional block (circuit) in a chip.

Here, the metal layer M4 is a thin wiring layer as in the case of the metal layers M1, M2 and M3. The metal layer M5 is thicker than the metal layers M1, M2, M3 and M4 and formed into a thick wiring layer. It is noted that the metal layer M5 which is the uppermost layer is used as, for example, a chip power source line.

Recently, there are a demand for, for example, providing a power source line on the intermediate layer of a semiconductor device and a demand for transferring signals at high speed. Due to this, it is desired that the thickness of the intermediate layer (e.g., the metal layer M3) of the semiconductor device is made almost equal to the thickness of the uppermost layer (metal layer M5).

Figure 5:
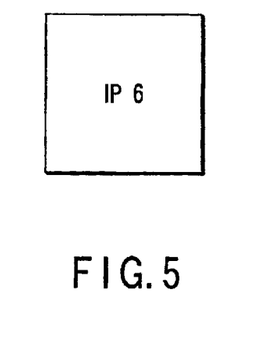
FIG. 5 shows an IP core.
Figure 6:
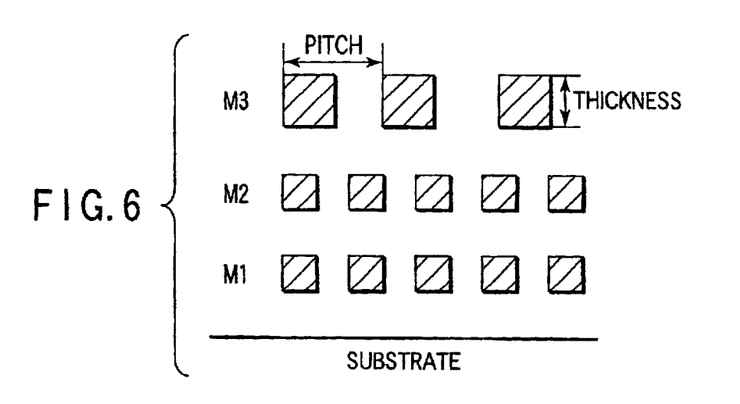
FIG. 6 is a cross-sectional view showing the device structure of the IP core shown in FIG. 5.

To do so, IP core is necessary to change the structure shown in FIGS. 1 and 2 to that show in FIGS. 5 and 6.

Figure 7:
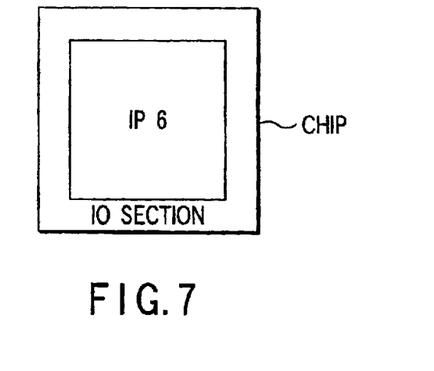
FIG. 7 shows a chip on which the IP core shown in FIG. 5 is mounted.
Figure 8:
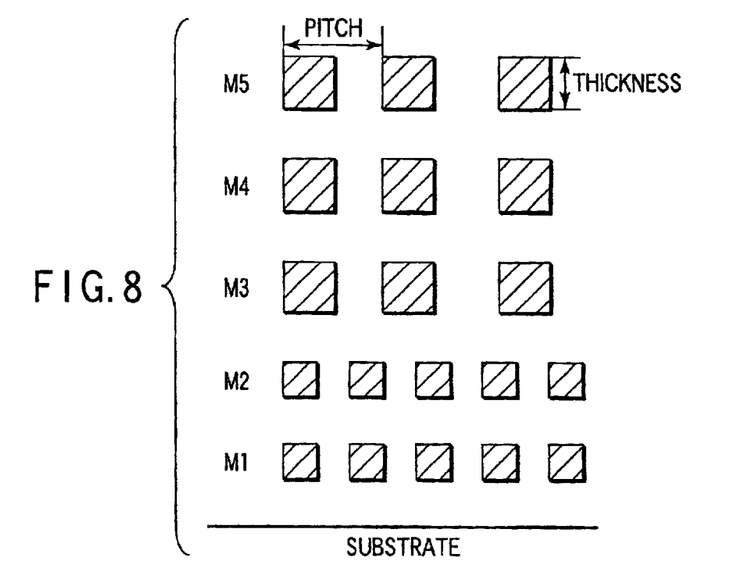
FIG. 8 is a cross-sectional view showing the structure of a semiconductor device shown in FIG. 7.

In the reference example, however, if the metal layer M3 of the IP core is made thicker as shown in FIGS. 5 and 6 and a semiconductor device is formed using this IP core, then all the metal layers on the metal layer M3, i.e., the metal layers M4 and M5 are also made to be formed into thick wiring layers as shown in FIGS. 7 and 8.

In that case, the wiring pitches of the metal layers M3, M4 and M5 naturally widen, with the result that the number of wirings (the number of signal lines, in particular) cannot be disadvantageously increased on the layers on the metal layer M3.

Further, in case of an ordinary semiconductor device, only the uppermost layer (metal layer M5) is a thick wiring layer and the remaining metal layers (metal layers M1, M2, M3 and M4) are thin wiring layers. As shown in FIGS. 5 and 6, therefore, if the metal layer M3 of the IP core is made thick, this IP core cannot be used for designing such an ordinary semiconductor device and the semiconductor device must be designed from the beginning.

2. First Embodiment

Figure 9:
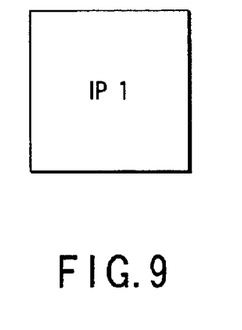
FIG. 9 shows an IP core.
Figure 10:
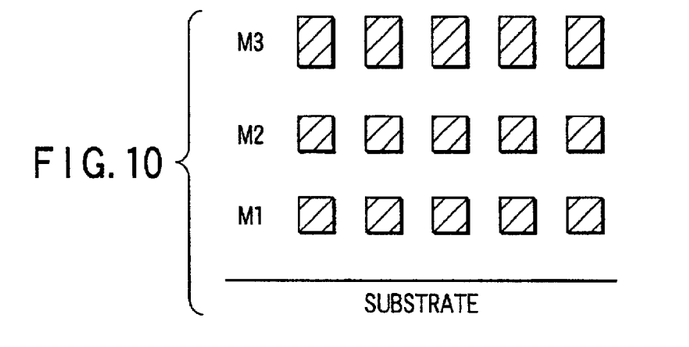
FIG. 10 is a cross-sectional view showing the device structure of the IP core shown in FIG. 9.

FIG. 9 shows an IP core. FIG. 10 shows one example of the device structure of the IP core shown in FIG. 9.

In this embodiment, the IP core (IP1) is realized by three metal layers M1, M2 and M3. The metal layers M1 and M2 of the IP core are mainly used as signal lines and formed into thin wiring layers. The uppermost layer (metal layer) M3 of the IP core is mainly used as a core power source line, thicker than the metal layers M1 and M2 and formed into a thick wiring layer.

In this embodiment, it is assumed that the metal layers M1 and M2 have the same wiring width. Also, the metal layer M3 has a large width on a portion used as, for example, a core power source line and a small wiring width on portions used as signal lines as shown in FIG. 10 as in the case of the metal layers M1 and M2. It is noted that the portion of the metal layer used as the core power source line may have a small width.

Figure 11:
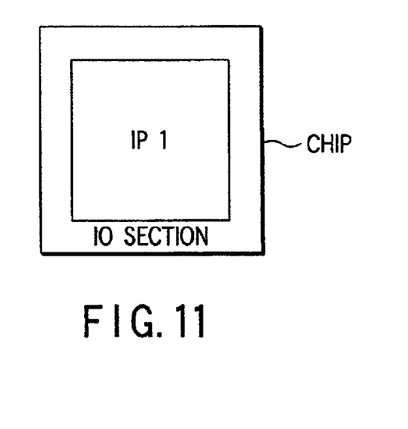
FIG. 11 shows a chip on which the IP core shown in FIG. 9 is mounted.
Figure 12:
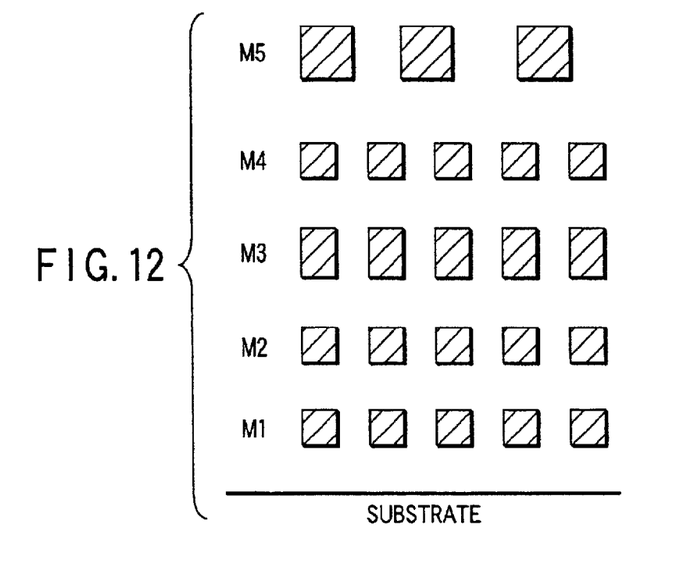
FIG. 12 is a cross-sectional view showing the structure of a semiconductor device shown in FIG. 11.

If this IP core is used in a design phase, the metal layers M1, M2 and M3 are used as they are. In addition, as shown in FIGS. 11 and 12, metal layers M4 and M5 are added, thereby providing a predetermined function block (circuit) in the chip.

Here, the metal layer M4 is mainly used as signal lines and formed into a thin wiring layer as in the case of the metal layers M1 and M2. The uppermost layer (metal layer) M5 of the semiconductor device is mainly used as a chip power source line and pad metal and formed into a thick wiring layer as in the case of the metal layer M3.

As can be seen, the semiconductor device according the present invention is characterized in that at least one of the intermediate layers (wiring layers excluding the uppermost and lowermost layers) among a plurality of wiring layers is constituted out of a thick film and that at least one wiring layer on the at least one intermediate layer is constituted out of a thin film.

In other words, in the reference example, the thick wiring layer is formed on the thin wiring layer and no thin wiring layer is formed on the thick wiring layer. According the present invention, by contrast, a thin wiring layer can be formed on the thick wiring layer as required.

As a result, if the uppermost layer of the IP core is constituted out of a thick film to use the uppermost layer of the IP core as, for example, a core power source line, a wiring layer used as signal lines further above the uppermost layer of the IP core can be constituted out of a thin film in the semiconductor device using this IP core.

Furthermore, the core power source line can enhance the performance of the IP core (functional block) and enables the wiring layer on the uppermost layer of the IP core to be constituted out of a thin film. Due to this, wiring efficiency can be enhanced and optimum IP designing and product development can be carried out.

3. Second Embodiment

Figure 13:
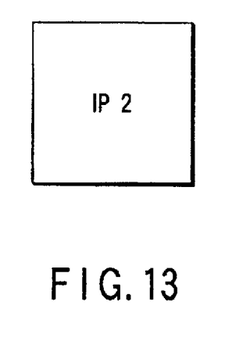
FIG. 13 shows an IP core.
Figure 14:
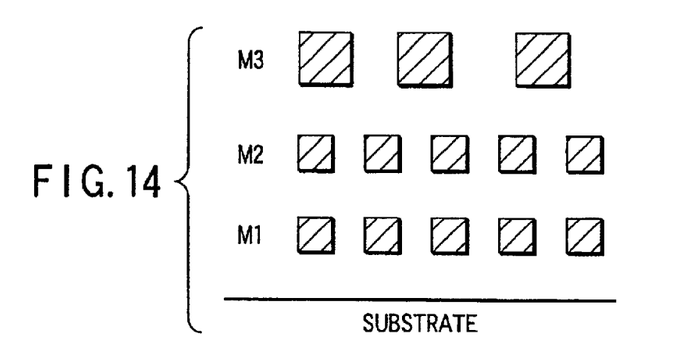
FIG. 14 is a cross-sectional view showing the device structure of the IP core shown in FIG. 13.

FIG. 13 shows an IP core. FIG. 14 shows one example of the device structure of the IP core shown in FIG. 13.

The IP core (IP2) in this embodiment has a function different from that of, for example, the IP core (IP1) shown in FIGS. 9 and 10. However, the number of metal layers and the thicknesses of the respective metal layers are common to the both IP cores.

The IP core (IP1) is realized by three metal layers M1, M2 and M3. The metal layers M1 and M2 of the IP core are mainly used as signal lines and formed into thin wiring layers. The uppermost layer (metal layer) M3 of the IP core is mainly used as a core power source line, thicker than the metal layers M1 and M2 and formed into a thick wiring layer.

In this embodiment, it is assumed that the metal layers M1 and M2 have the same wiring width. In addition, the metal layer M3 has a large width on a portion used as the core power source line and a small wiring width on parts used as signal lines as in the case of the metal layers M1 and M2 as shown in FIG. 14. It is noted that the portion of the metal layer used as the core power source line may have a small width.

Figure 15:
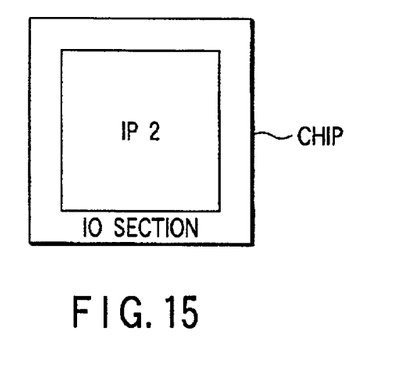
FIG. 15 shows a chip on which the IP core shown in FIG. 13 is mounted.
Figure 16:
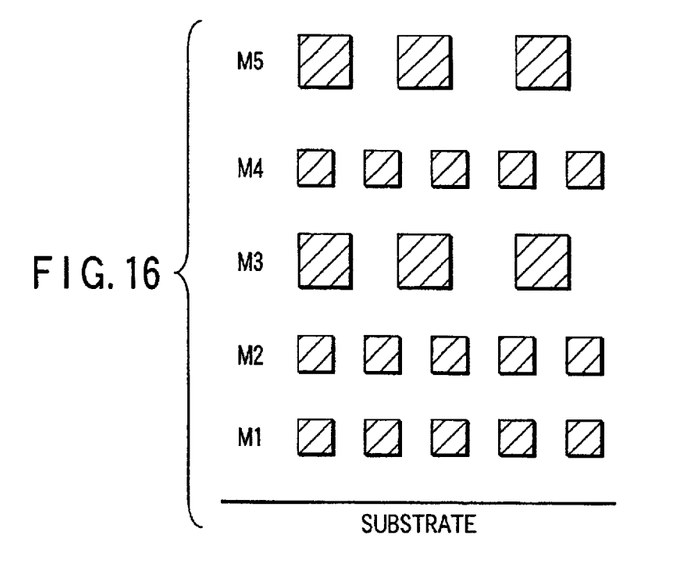
FIG. 16 is a cross-sectional view showing the structure of a semiconductor device shown in FIG. 15.

If this IP core is used in a design phase, the metal layers M1, M2 and M3 are used as they are and, as shown in FIGS. 15 and 16, metal layers M4 and M5 are added, thereby forming a predetermined functional block (circuit) in the chip.

Here, the metal layer M4 is mainly used as signal lines and formed into a thin wiring layer as in the case of the metal layers M1 and M2. On the other hand, the uppermost layer (metal layer) M5 of the semiconductor device is mainly used as a chip power source line and pad metal and formed into a thick wiring layer as in the case of the metal layer M3.

As can be seen, the semiconductor device according to the present invention is characterized in that at least one of the intermediate layers (wiring layers excluding the uppermost and lowermost layers) among a plurality of wiring layers is constituted out of a thick film and that at least one wiring layer on the at least one intermediate layer is constituted out of a thin film.

That is, in the reference example, the thick wiring layer is formed on the thin wiring layer and no thin wiring layer is formed on the thick wiring layer. According to the present invention, by contrast, a thin wiring layer can be formed on the thick wiring layer as required.

As a result, even if the uppermost layer of the IP core is constituted out of a thick film so as to use the uppermost layer of the IP core as a core power source line, a wiring layer used as signal lines further above the uppermost layer of the IP core can be constituted out of a thin film in the semiconductor device using this IP core.

Furthermore, the core power source line can enhance the performance of the IP core (functional block) and enables the uppermost wiring layer of the IP core to be constituted out of a thin film. Due to this, wiring efficiency can be enhanced and optimum IP designing and product development can be carried out.

Figure 17:
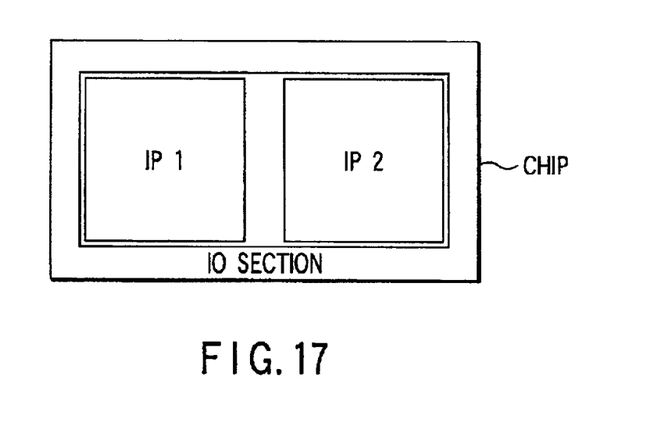
FIG. 17 shows a chip on which the IP core shown in FIG. 9 and the IP core shown in FIG. 13 are mounted.
Figure 18:
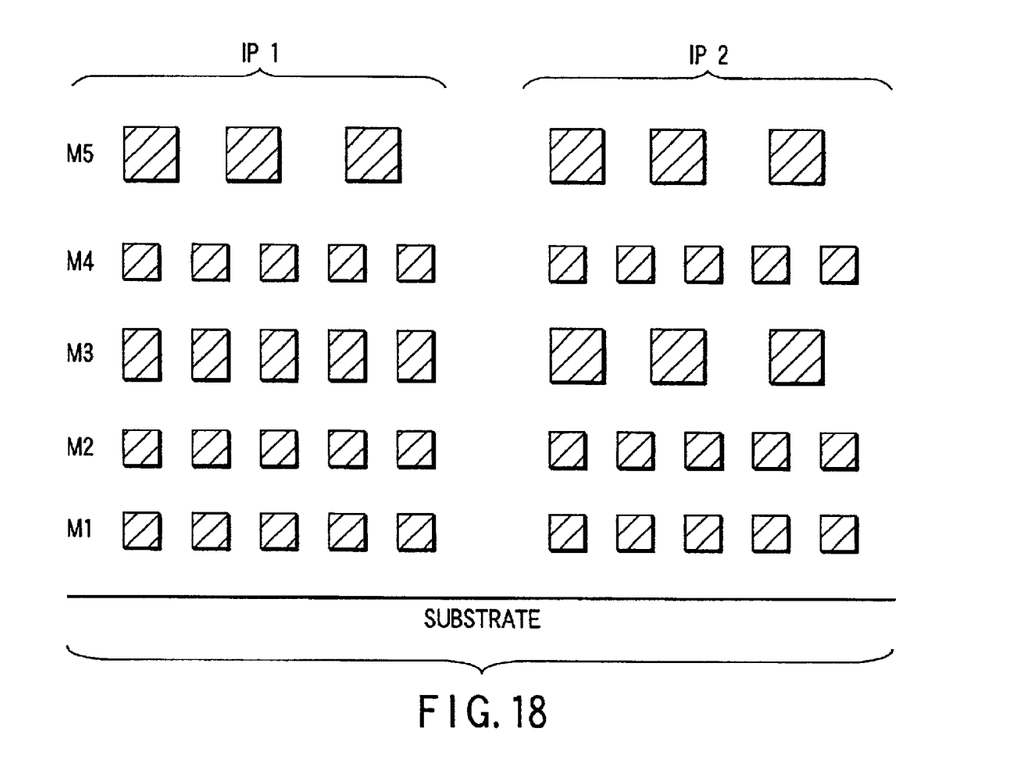
FIG. 18 is a cross-sectional view showing the structure of a semiconductor device shown in FIG. 17.

Meanwhile, according to the present invention, the IP core (IP1) shown in FIGS. 9 and 10 and the IP core (IP2) shown in FIGS. 13 and 14 have the common number of wiring layers and the common thicknesses of the respective wiring layers. Accordingly, as shown in FIGS. 17 and 18, even if the IP core (IP1) and the IP core (IP2) are mounted on one semiconductor chip to constitute one semiconductor system, the layouts of the respective IP cores can be utilized as they are. Therefore, design efficiency is enhanced and semiconductor device development period can be thereby shortened.

4. Third Embodiment

Figure 19:
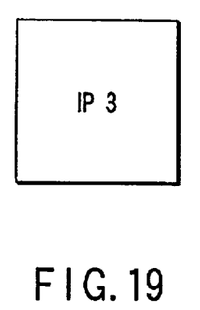
FIG. 19 shows an IP core.
Figure 20:
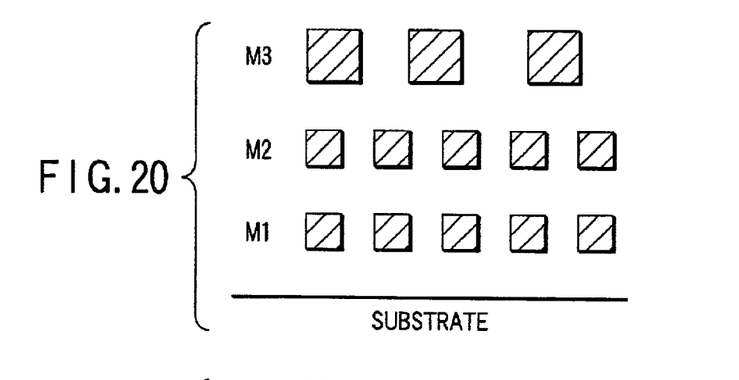
FIG. 20 is a cross-sectional view showing the device structure of the IP core shown in FIG. 19.

FIG. 19 shows an IP core. FIG. 20 shows one example of the device structure of the IP core shown in FIG. 19.

In this embodiment, the IP core (IP3) is realized by three metal layers M1, M2 and m3. The metal layers M1 and M2 of the IP core are mainly used as signal lines and formed into thin wiring layers. Also, the uppermost layer (metal layer) M3 of the IP core is mainly used as a core power source line, thicker than the metal layers M1 and M2 and formed into a thick wiring layer.

In this embodiment, it is assumed that the metal layers M1 and M2 have the same wiring width. In addition, the metal layer M3 has a large width on, for example, a portion used as the core power source line and a small wiring width on portions used as signal lines as in the case of the metal layers M1 and M2 as shown in FIG. 20. It is noted, however, that the portion of the metal layer used as the core power source line may have a small width.

Figure 21:
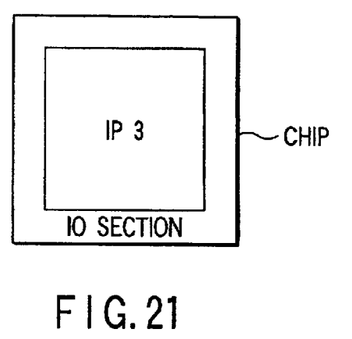
FIG. 21 shows a chip on which the IP core shown in FIG. 19 is mounted.
Figure 22:
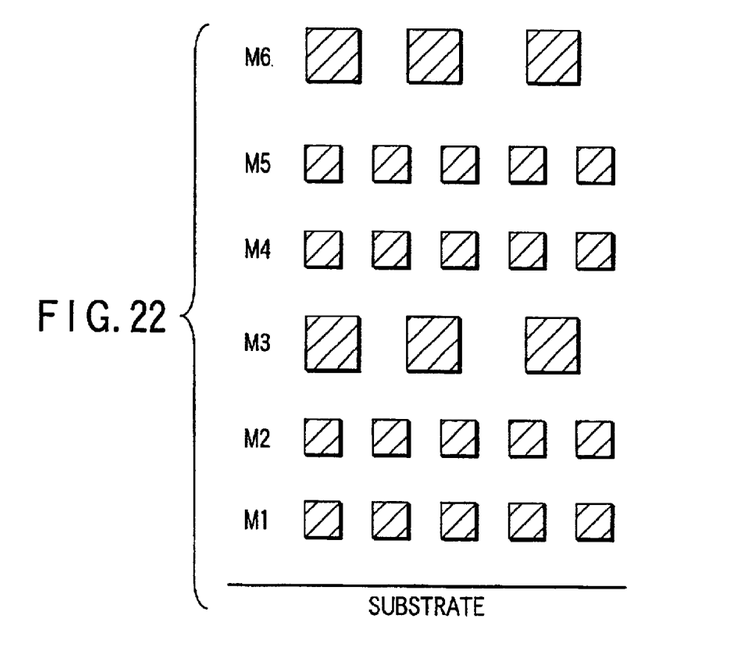
FIG. 22 is a cross-sectional view showing the structure of a semiconductor device shown in FIG. 21.

If this IP core is used in a design phase, the metal layers M1, M2 and M3 are used as they are and, as shown in FIGS. 21 and 22, metal layers M4, M5 and M6 are added, thereby forming a predetermined functional block (circuit) in the chip.

Here, the metal layers M4 and M5 are mainly used as signal lines and formed into thin wiring layers as in the case of the metal layers M1 and M2. The uppermost layer (metal layer) M6 of the semiconductor device is, on the other hand, mainly used as a chip power source line and pad metal and formed into a thick wiring layer as in the case of the metal layer M3.

As can be seen, the semiconductor device according to the present invention is characterized in that at least one of the intermediate layers (wiring layers excluding the uppermost and lowermost layers) among a plurality of wiring layers is constituted out of a thick film and that at least one wiring layer on the at least one intermediate layer is constituted out of a thin film.

Namely, in the reference example, the thick wiring layer is formed on the thin wiring layer and no thin wiring layer is formed on the thick wiring layer. According to the present invention, by contrast, a thin wiring layer can be formed on the thick wiring layer as required.

As a result, even if the uppermost layer of the IP core is constituted out of a thick film so as to use the uppermost layer of the IP core as, for example, a core power source line, a wiring layer used as signal line further above the uppermost layer of the IP core can be constituted out of a thin film in the semiconductor device using this IP core.

Furthermore, the core power source line can enhance the performance of the IP core (functional block) and enables the wiring layer on the uppermost layer of the IP core to be constituted out of a thin film. Due to this, wiring efficiency can be enhanced and optimum IP designing and product development can be carried out.

5. Fourth Embodiment

Figure 23:
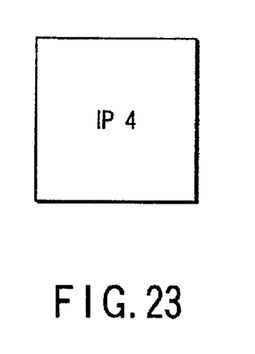
FIG. 23 shows an IP core.
Figure 24:
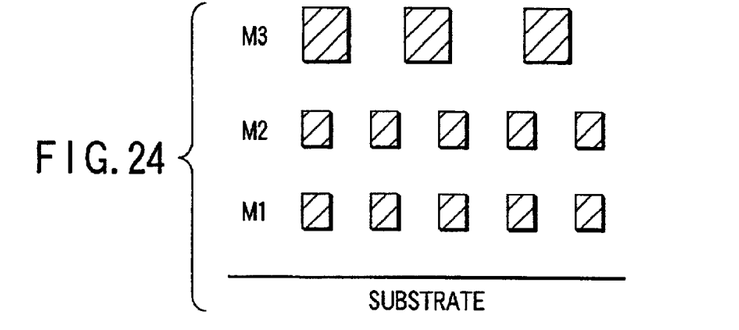
FIG. 24 is a cross-sectional view showing the device structure of the IP core shown in FIG. 23.

FIG. 23 shows an IP core. FIG. 24 shows one example of the device structure of the IP core shown in FIG. 23.

The IP core (IP4) in this embodiment has a different function from that of, for example, the IP core shown in FIGS. 19 and 20. However, the number of metal layers and the thicknesses of the respective metal layers are common to the both IP cores.

The IP core (IP3) is realized by three metal layers M1, M2 and M3. The metal layers M1 and M2 of the IP core are mainly used as signal lines and formed into thin wiring layers. Also, the uppermost layer (metal layer) M3 of the IP core is mainly used as a core power source line, thicker than the metal layers M1 and M2 and formed into a thick wiring layer.

In this embodiment, it is assumed that the metal layers M1 and M2 have the same wiring width. Also, the metal layer M3 has a large width on a portion used as, for example, the core power source line and, as shown in FIG. 24, a small wiring width on portions used as signal lines as in the case of the metal layers M1 and M2. It is noted, however, that the portion of the metal layer M3 used as the core power source line may have a small width.

Figure 25:
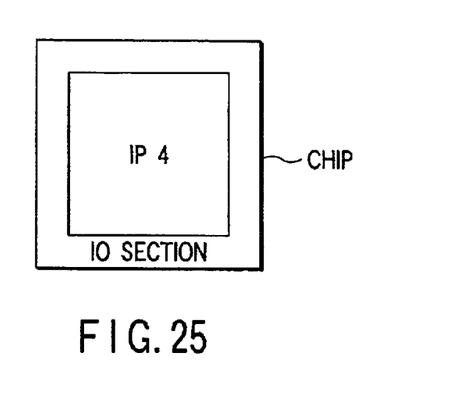
FIG. 25 shows a chip on which the IP core shown in FIG. 23 is mounted.
Figure 26:
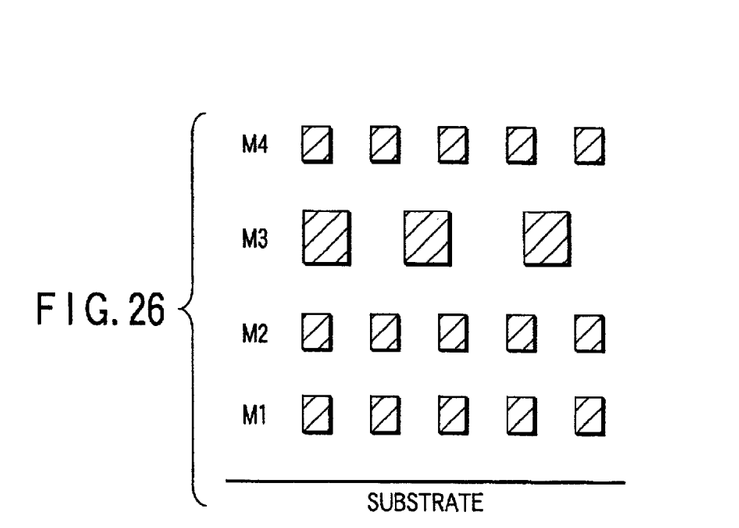
FIG. 26 is a cross-sectional view showing the structure of a semiconductor device shown in FIG. 25.

If this IP core is used in a design phase, the metal layers M1, M2 and M3 are used as they are and, as shown in FIGS. 25 and 26, a metal layer M4 is added, thereby forming a predetermined functional block (circuit) in the chip. Here, the metal layer M4 is mainly used as signal lines and formed into a thin wiring layer as in the case of the metal layers M1 and M2.

As can be seen, the semiconductor device according to the present invention is characterized in that at least one of the intermediate layers (wiring layers excluding the uppermost and lowermost layers) among a plurality of wiring layers is constituted out of a thick film and that at least one wiring layer on the at least one intermediate layer is constituted out of a thin film.

Namely, in the reference example, the thick wiring layer is formed on the thin wiring layer and no thin wiring layer is formed on the thick wiring layer. According to the present invention, by contrast, a thin wiring layer can be formed on the thick wiring layer as required.

As a result, even if the uppermost layer of the IP core is constituted out of a thick film so as to use the uppermost layer of the IP core as, for example, a core power source line, a wiring layer used as signal lines further above the uppermost layer of the IP core can be constituted out of a thin film in the semiconductor device using this IP core.

Furthermore, the core power source line can enhance the performance of the IP core (functional block) and enables the wiring layer on the uppermost layer of the IP core to be constituted out of a thin film. Due to this, wiring efficiency can be enhanced and optimum IP designing and product development can be ensured.

Figure 27:
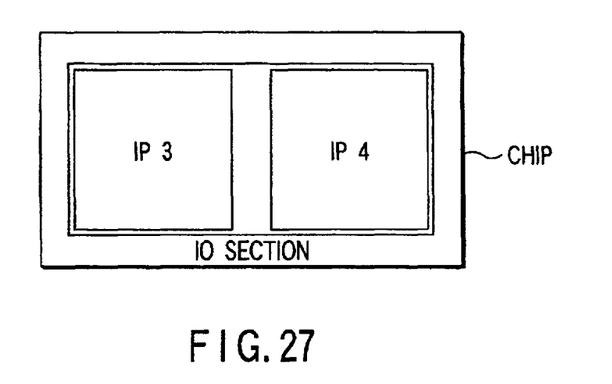
FIG. 27 shows a chip on which the IP core shown in FIG. 19 and the IP core shown in FIG. 23 are mounted.
Figure 28:
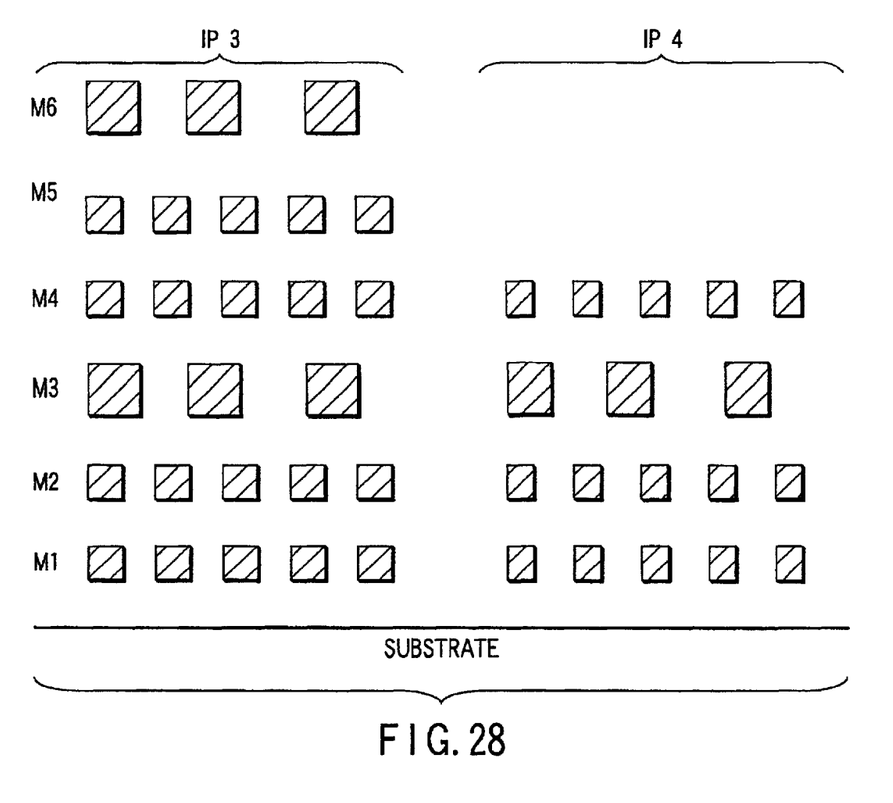
FIG. 28 is a cross-sectional view showing the structure of the semiconductor device shown in FIG. 27.

In the meantime, according to the present invention, the number of wiring layers and the thicknesses of the respective wiring layers are common to the IP core (IP3) shown in FIGS. 19 and 20 and the IP core (IP4) shown in FIGS. 23 and 24. Accordingly, as shown in, for example, FIGS. 27 and 28, even if the IP core (IP3) and the IP core (IP4) are mounted on one semiconductor chip to constitute one system, the layouts of the respective IP cores can be utilized as they are. Due to this, design efficiency can be enhanced and semiconductor device development period can be thereby shortened.

6. Others

Figure 29:
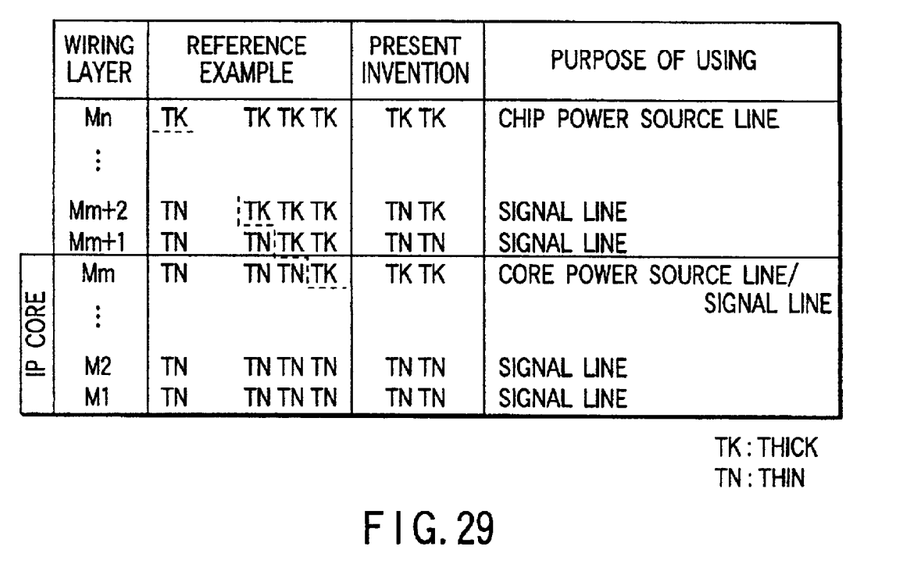
FIG. 29 shows the comparison between the present invention and a reference example in respect of the length of a wiring layer.

FIG. 29 shows the relationship between the thicknesses of the respective wiring layers of the semiconductor device according to the present invention and those of the respective wiring layers of the semiconductor device in the reference example.

It is assumed, for example, that the IP core is constituted out of m (where m is a natural number) wiring layers and a semiconductor device using this IP core is constituted out of n (where n is a natural number satisfying n>m) wiring layers. In this case, the thick wiring layer is always formed on the lowermost thick wiring layer in the reference example. According to the present invention, by contrast, a thin wiring layer can be formed on the lowermost thick wiring layer as required.

Figure 30:
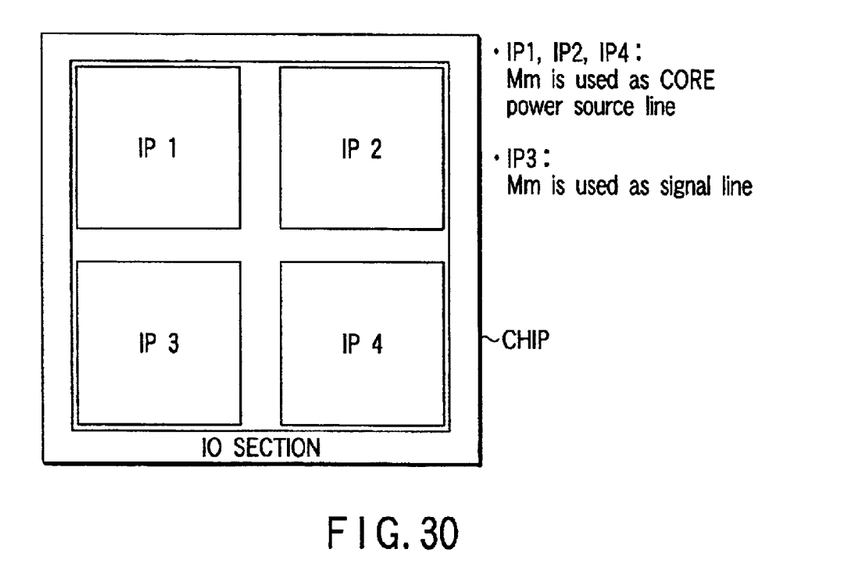
FIG. 30 shows a chip on which four IP cores are mounted.

FIG. 30 shows an example in which four IP cores are mounted on one semiconductor chip.

With such a system LSI, the uppermost layers Mm of the IP cores (IP1, IP2, IP4), for example, can be used as core power source lines, respectively, and the uppermost layer Mm of the IP core (IP3) can be used as signal lines. It is noted that the electrical connection of the respective IP cores can be established using wiring layers (e.g., M1 to Mm) arranged in the spaces between the respective IP cores. Alternatively, the electrical connection can be established using wiring layers (e.g., Mm+1 to Mn) on the wiring layers of the IP cores.

The present invention can be applied to any semiconductor devices or particularly applied to semiconductor device using an IP core, e.g., a logic LSI on which mixed memories are mounted and a system LSI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first wiring layer having a first thickness and provided above the semiconductor substrate; and
   a second wiring layer having a second thickness thinner than the first thickness and provided above the first wiring layer,
   wherein the first wiring layer comprises a first area having signal lines and a second area having power source lines, and a pitch of the power source lines is greater than that of the signal lines.

2. A semiconductor device according to claim 1, further comprising:
   a lowermost wiring layer nearest to the semiconductor substrate and provided below the first wiring layer; and
   an uppermost wiring layer farthest from the semiconductor substrate and provided above the second wiring layer.

3. A semiconductor device according to claim 2, wherein a wiring pitch of the first wiring layer is greater than that of the second wiring layer.

4. A semiconductor device according to claim 2, wherein the first wiring layer is a layer a power source line is formed.

5. A semiconductor device according to claim 2, wherein the first wiring layer comprises a first area having signal lines and a second area having power source lines, and a width of each of the power sources lines is greater than that of the signal lines.

6. A semiconductor device according to claim 2, wherein the first wiring layer is substantially as thick as the uppermost wiring layer.

7. A semiconductor device according to claim 2, wherein the second wiring layer is substantially as thick as the lowermost wiring layer.

8. A semiconductor device according to claim 2, wherein all of the uppermost wiring layer, the lowermost wiring layer and the first and second wiring layers are metal layers.

9. A semiconductor device comprising:
   a semiconductor substrate;
   an IP core urea on the semiconductor substrate;
   a peripheral area on the semiconductor substrate except for the IP core area;
   a first wiring layer having a first thickness and provided above the semiconductor substrate in the IP core area; and
   a second wiring layer having a second thickness smaller than the first thickness and provided above the first wiring layer in the IP core area,
   wherein the first wiring layer comprises a first area having signal lines and a second area having power source lines, and a pitch of the power source lines is greater than that of the signal lines.

10. A semiconductor device according to claim 9, further comprising:
    a lowermost wiring layer nearest to the semiconductor substrate and provided below the first wiring layer; and
    an uppermost wiring layer farthest from the semiconductor substrate and provided above the second wiring layer.

11. A semiconductor device according to claim 10, wherein the first wiring layer is a layer on which a core power source line is formed.

12. A semiconductor device according to claim 10, wherein a wiring pitch of the first wiring layer is greater than that of the second wiring layer.

13. A semiconductor device according to claim 10, wherein the first wiring layer is substantially as thick as the uppermost wiring layer.

14. A semiconductor device according to claim 10, wherein the second wiring layer is substantially as thick as the lowermost wiring layer.

15. A semiconductor device according to claim 10, wherein the first wiring layer comprises a first area having signal lines and a second area having power source lines, and a width of each of the power source lines is greater than that of the signal lines.

16. A semiconductor device according to claim 10, wherein all of the uppermost wiring layer, the lowermost wiring layer and the first and second wiring layers are metal layers.

17. A semiconductor device comprising:
    a semiconductor substrate;
    a first wiring layer having a first thickness and provided above the semiconductor substrate; and
    a second wiring layer having a second thickness thinner than the first thickness and provided above the first wiring layer,
    wherein the first wiring layer comprises a first area having signal lines and a second area having power source lines, and a width of each of the power sources lines is greater than that of the signal lines.

18. A semiconductor device according to claim 17, further comprising:
    a lowermost wiring layer nearest to the semiconductor substrate and provided below the first wiring layer; and
    an uppermost wiring layer farthest from the semiconductor substrate and provided above the second wiring layer.

19. A semiconductor device according to claim 17, wherein a wiring pitch of the first wiring layer is greater than that of the second wiring layer.

20. A semiconductor device comprising according to claim 17, wherein the first wiring layer is a layer on which a power source line is formed.

21. A semiconductor device according to claim 17, wherein the first wiring layer is substantially as thick as the uppermost wiring layer.

22. A semiconductor device according to claim 17, wherein the second wiring layer is substantially as thick as the lowermost wiring layer.

23. A semiconductor device according to claim 17, wherein all of the uppermost wiring layer, the lowermost wiring layer and the first and second wiring layers are metal layers.

24. A semiconductor device comprising:
    a semiconductor substrate;
    an IP core area on the semiconductor substrate;
    a peripheral end area on the semiconductor substrate except for the IP core area;
    a first wiring layer having a first thickness and provided above the semiconductor substrate in the IP core area; and
    a second wiring layer having a second thickness smaller than the first thickness and provided above the first intermediate wiring layer in the IP core area,
    wherein the first wiring layer comprises a first area having signal lines and a second area having power source lines, and a width of each of the power source lines is greater than that of the signal lines.

25. A semiconductor device according to claim 24, further comprising:
    a lowermost wiring layer nearest to the semiconductor substrate and provided below the first wiring layer; and
    an uppermost wiring layer furthest from the semiconductor substrate and provided above the second wiring layer.

26. A semiconductor device according to claim 24, wherein the first wiring layer is a layer on which a core power source line is formed.

27. A semiconductor device according to claim 24, wherein a wiring pitch of the first wiring layer is greater than that of the second intermediate wiring layer.

28. A semiconductor device according to claim 24, wherein the first wiring layer is substantially an thick as the uppermost wiring layer.

29. A semiconductor device according to claim 24, wherein the second wiring layer is substantially as thick as the lowermost wiring layer.

30. A semiconductor device according to claim 24, wherein all of the uppermost wiring layer, the lowermost wiring layer and the first and second wiring layers are metal layers.

31. A semiconductor device comprising:
    a semiconductor substrate;
    a first wiring layer having a first thickness, extending in a direction parallel to a surface of the semiconductor substrate, and provided above the semiconductor substrate;
    a second wiring layer having a second thickness rater than the first thickness, extending in the direction, and provided between the semiconductor substrate and the first wiring layer; and
    a third wiring layer having a third thickness greater than the first thickness, extending in the direction, and provided above the first wiring layer;
    wherein the first wiring layer comprises a first area having signal lines and each of the second and third layers comprise a second area having power source lines, and pitch of the power source lines is mater than that of the signal lines.

32. A semiconductor device comprising:
    a semiconductor substrate;
    a first wiring layer having a first thickness, extending in a direction parallel to a surface of the semiconductor substrate, and provided above the semiconductor substrate;
    a second wiring layer having a second thickness smaller than the first thickness, extending the direction, and provided between the semiconductor substrate and the first wiring layer; and
    a third wiring layer having a third thickness smaller than the first thickness, extending in the direction, and provided above the first wiring layer;
    wherein the first wiring layer comprises a first area having signal lines, and each of the second and third layers comprise a second area having signal lines, and a pitch of the power source lines is greater than that of the signal lines.

* * * * *